United States Patent [19]
Alexander

[11] Patent Number: 6,087,873
[45] Date of Patent: Jul. 11, 2000

[54] PRECISION HYSTERESIS CIRCUIT

[75] Inventor: Daniel D. Alexander, Gilbert, Ariz.

[73] Assignee: Motorola, Inc., Schaumburg, Ill.

[21] Appl. No.: 09/119,945

[22] Filed: Jul. 21, 1998

[51] Int. Cl.[7] .................................................. H03K 3/037
[52] U.S. Cl. ............................................ 327/206; 327/74
[58] Field of Search ................................ 327/68, 74, 205, 327/206, 198, 142, 307, 337

[56] References Cited

U.S. PATENT DOCUMENTS

| | | | |
|---|---|---|---|
| 4,394,587 | 7/1983 | McKenzie et al. | 307/355 |
| 5,528,185 | 6/1996 | Lewicki et al. | 327/206 |
| 5,656,957 | 8/1997 | Marlow et al. | 327/205 |

Primary Examiner—Toan Tran
Attorney, Agent, or Firm—Anthony M. Martinez

[57] ABSTRACT

A switched capacitor differential comparator (10) for receiving input signals which includes hysteresis circuitry (40, and 42) and a switch (43) responsive to timed clocking pulses occurring during alternating reset and comparison periods for application of a hysteresis current during a reset period of the differential comparator which current is injected into an applicable one of a pair of load devices (22, 24) to produce a hysteresis voltage offset at a selected one of the differential inputs (30, 32) which is stored during the reset period but removed during the next comparison period so that the hysteresis voltage is not canceled but remains superimposed on the stored input signals during the next comparison period to introduce hysteresis to influence the current output decision of the comparator circuit based on the decision of the comparator resulting from the previous comparison period.

10 Claims, 2 Drawing Sheets

PRECISION HYSTERESIS CIRCUIT

BACKGROUND OF THE INVENTION

The present invention relates to hysteresis circuits and, more particularly, to a precision hysteresis circuit for introducing hysteresis into a comparator circuit.

Comparators are widely used in a variety of electronic equipment to compare differential input signals applied thereto to provide differential digital output signals. The output signals will change voltage level states depending upon which of the inputs of the comparator is the higher. Adding hysteresis offset is required in many applications to provide noise immunity and to prevent the outputs from "chattering" when the inputs to the comparator hover near the threshold of the comparator.

In addition, several programmable levels of hysteresis may be made available to the user in his application of the comparator. These levels of programmable hysteresis may also be tightly toleranced over temperature variations and process variations if the comparators are manufactured in integrated circuit form. Further, the comparator having hysteresis may be required for use in a switch capacitor programmable analog array which requires the comparator and the hysteresis producing circuit to run at high switching frequencies wherein the comparator is operated on reset and comparison cycles.

One known method of introducing hysteresis is to steer a small current into one load of the differential comparator during the comparison cycle. This results in an output directional offset which would have to be overcome by the next set of inputs applied to the comparator. One disadvantage of this scheme when using a fixed amount of injection current is variation of the resulting offset due to device variations of the comparator caused by process variations in the manufacture of integrated circuits and with temperature variations.

Hence, a need exists for a comparator for use in a switched applications having programmable hysteresis in which the hysteresis can be maintained to a tight tolerance over temperature and integrated circuit process variations.

DETAILED DESCRIPTION OF THE PREFERRED EMBODIMENT

Figure 1:
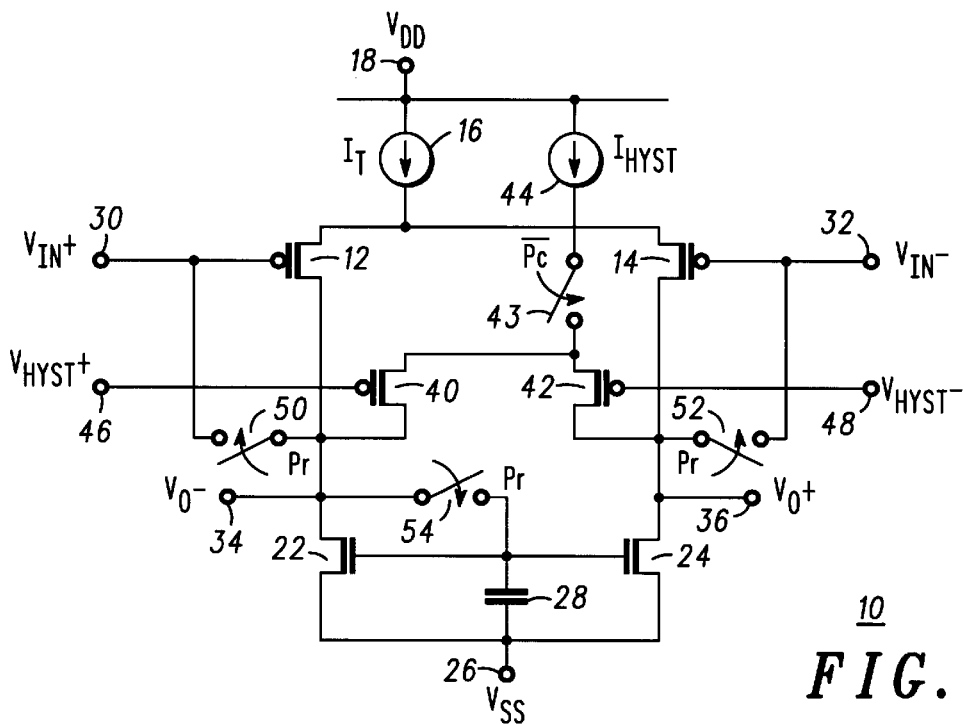
FIG. 1 is a simplified schematic diagram of a comparator having hysteresis in accordance with the preferred embodiment of the invention.

Referring to FIG. 1 a simplified schematic diagram of comparator 10 having a hysteresis producing circuit as will be discussed. Comparator 10 includes a pair of differentially connected PMOS transistors 12 and 14 the gates or control electrodes are connected to inputs 30 and 32 across which differential signals $V_{IN}+$ and $V_{IN}-$ are applied. The source or first electrodes of PMOS transistors 12 and 14 are connected to current source 16 which, in turn, is coupled to terminal 18 at which voltage supply, $V_{DD}$, is provided such that tail current $I_T$ is sourced to the differential transistor pair. The drains or second electrodes of PMOS transistors 12 and 14 are connected to a pair of load devices which, as shown, are NMOS transistors 22 and 24. The drains or second electrodes of NMOS transistors 22 and 24 are coupled to the drains of PMOS transistors 12 and 14 respectively while their source or first electrodes are coupled to node 26, which is coupled for receiving voltage $V_{SS}$. A voltage holding capacitor 28 is connected between the gates or control electrodes of NMOS transistors 22 and 24 and terminal 26. During the comparison phase, differential output signals $V_O-$ and $V_O+$ are produced at outputs 34 and 36 as generally is understood responsive to the differential input signals applied across inputs 30 and 32. A pair of PMOS transistors 40 and 42 comprising the hysteresis circuit of the present invention have their source electrodes coupled via switch 43 to current source 44 which supplies a programmable hysteresis current $I_{HYST}$ which is injected into one of the applicable load devices via the drain of either transistor 40 or 42, whichever is selected by the predetermined differential hysteresis voltage, $V_{HYST}+$ and $V_{HYST}-$, applied across terminals 46 and 48 to the gates of transistors 40 and 42 as will be further explained in detail. Switches 50, 52, and 54 are shown which are closed during the reset phase for connecting PMOS transistors 12 and 14 as well as NMOS transistor 22 as diodes.

Figure 2:
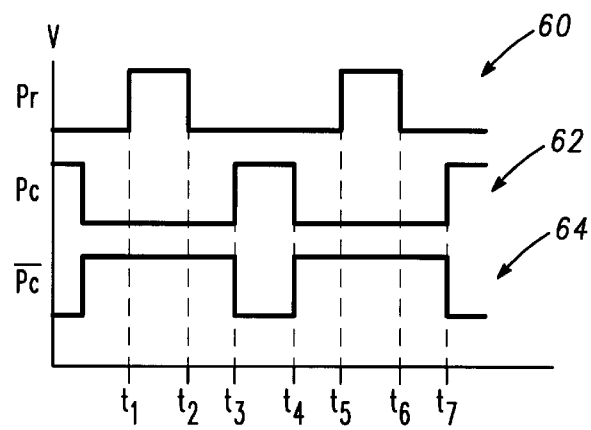
FIG. 2 is a graph showing dock pulses useful for explaining the present invention.
Figure 3:
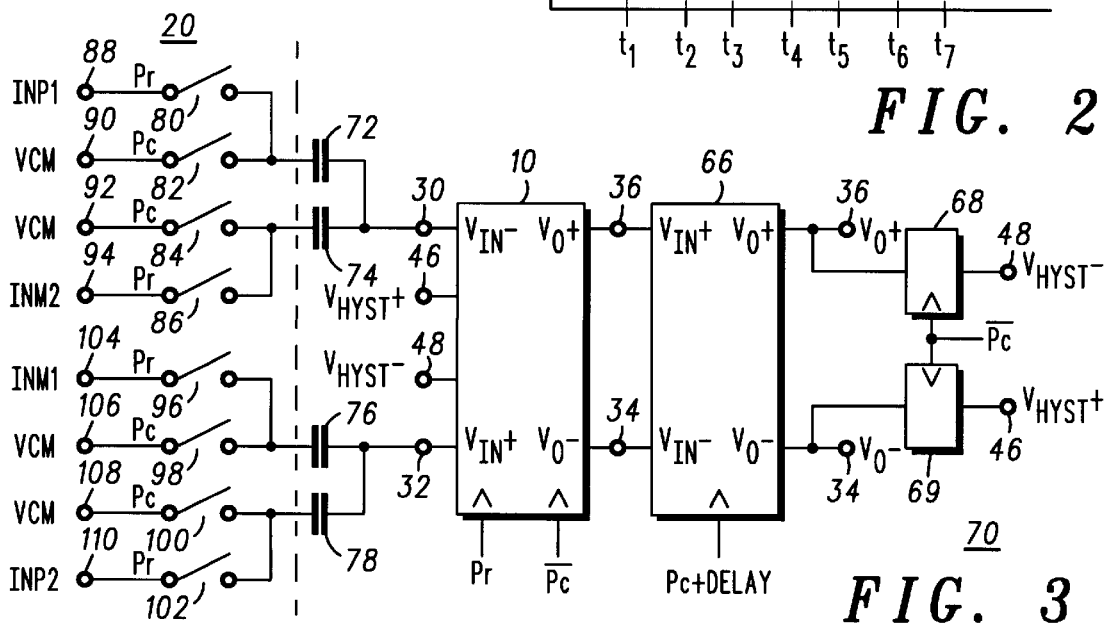
FIG. 3 is a partial block and schematic diagram of the capacitor switching arrangement which is useful in explaining the present invention.

The operation of the comparator and hysteresis circuit will be hereinafter explained in conjunction with use of FIGS. 2 and 3. As shown in FIG. 2, three dock pulses 60, 62, and 64 are provided which, as will be discussed, permit the timed application of hysteresis into the comparator stage 10 during the reset thereof. Reset dock pulse 60 ($P_r$) is utilized to close switches 50, 52, and 54 to reset comparator and hysteresis circuit 10 during the reset period while comparison clock pulse 62 ($P_c$) is applied during the comparison period. Clock pulse 64 ($P_c$) which is anti-phase with respect to clock pulse $P_c$ is used to close switch 43 of the hysteresis circuit when the clock pulse is high, during the reset period and non-overlapping period of pulse 60 and 62. As illustrated, during times $t_2-t_3$ and $t_4-t_5$ clock pulses 60 and 62 are non-overlapping, i.e., neither will be clocked high at the same time.

Initially, assume that no hysteresis is introduced in comparator 10, for example, the gates of transistors 40 and 42 of the hysteresis circuit portion of comparator 10 may be forced high thereby rendering them non-conductive. Thus, during a reset period, t1–t2, $P_r$ is high and $P_c$ is low. Transistors 12 and 14 will be diode connected as their gates are directly connected to their drains via switches 50 and 52. Gate 54 is also closed which connects load transistors 22 and 24 as a well known current mirror. With theses load devices connected in a current mirror configuration, one-half of the current $I_T$ is forced through each of the input transistors 12 and 14 and injected into load devices 22 and 24. Any circuit offset due to current differences caused by mismatch in load transistors 22 and 24 or due to gm variations in input devices 12 and 14 will cause a voltage offset to be stored on terminals 30 and 32, on the inputs of capacitors 72, 74, 76, and 78 of switched capacitor circuit 20. However this offset voltage will be canceled during the comparison phase. The differential input signals to be compared, INP1, INM2, INP2, and INM1 are stored on the opposite ends of the capacitors and superimposed onto any voltage offset of the comparator 10 via switches 80, 86, 96 and 102 being closed responsive to $P_r$.

Assuming now that it is desired to introduce a hysteresis offset voltage onto one or the other inputs 30 and 32 the action of the hysteresis circuitry including transistors 40, 42, switch 43 and current source 44 will be examined. Latch and processing circuit 66 will generate the $V_{HYST}+$ and $V_{HYST}-$ signals appearing at inputs 46 and 48 of the hysteresis circuit portion of comparator 10. These signals are latched to a value to hold the decision of the previous cycle until the comparison period is initiated for the current timing cycle. Thus, if prior to time t1, it is assumed that $V_O+$ is high, then $V_{HYST}-$ at t1 will be high while $V_{HYST}+$ is low, being latched to these states via latch and processing circuit 66, which is coupled to the outputs of comparator 10, driving latches 68 and 69. This will cause transistor 40 to be conductive such that with switch 43 being closed the hysteresis current, $I_{HYST}$, will be injected into the drain of transistor 22 anytime that a comparison phase is not being made by $P_c$ being in a high state. Since the load transistors are connected as a current mirror during t1–t2, the currents flowing in these load devices must be equal as described above. The injected hysteresis current will therefore cause the current flow through transistor 12 to be less than the current flow through transistor 14 in order to maintain equal load device currents. Hence, the voltage $V_{IN}+$ will be higher than $V_{IN}-$ by the factor $$\frac{1}{gm(12,14)} * I_{HYST}.$$

This hysteresis voltage offset will be stored across the inputs by the sampling capacitors of circuit 20 (along with any mismatch voltage offsets as described earlier) during the reset phase. During the next comparison period the source of the hysteresis offset voltage is removed as switch 43 is opened. Thus, the hysteresis offset voltage will not be canceled by the comparator and will have to be overcome by the input signal voltages being compared at the differential inputs of the comparator.

During non-overlap period, t2–t3, comparator 10 is taken out of reset but no inputs are applied as switches 80 through 102 are open. Comparator 10 is now in an open loop configuration and can make a decision. In order to prevent a decision based solely on the hysteresis offset voltage the hysteresis current is still applied to the appropriate side of the load devices as switch 43 is still rendered closed.

During comparison period, t3–t4, $P_c$ is high which forces switches 82, 84, 98, and 100 to close thereby shorting capacitors 72, 74, 76 and 78 to a common mode voltage $V_{CM}$. This switching of the capacitors between the reset period and comparison period will cause any mismatch offsets stored across the capacitors to be canceled while a differential input voltage (INP1–INP2) minus (INM1–INM2) plus the hysteresis voltage offset is applied across inputs 30 and 32. For the circuit described, the magnitude of the hysteresis voltage offset will be positive if the previous output decision was high and negative if the previous decision was low. During t3–t4, $I_{HYST}$ is not applied to the hysteresis circuit portion and comparator 10 is free to respond to the inputs applied to inputs 30 and 32 in order to make its next decision.

Figure 4:
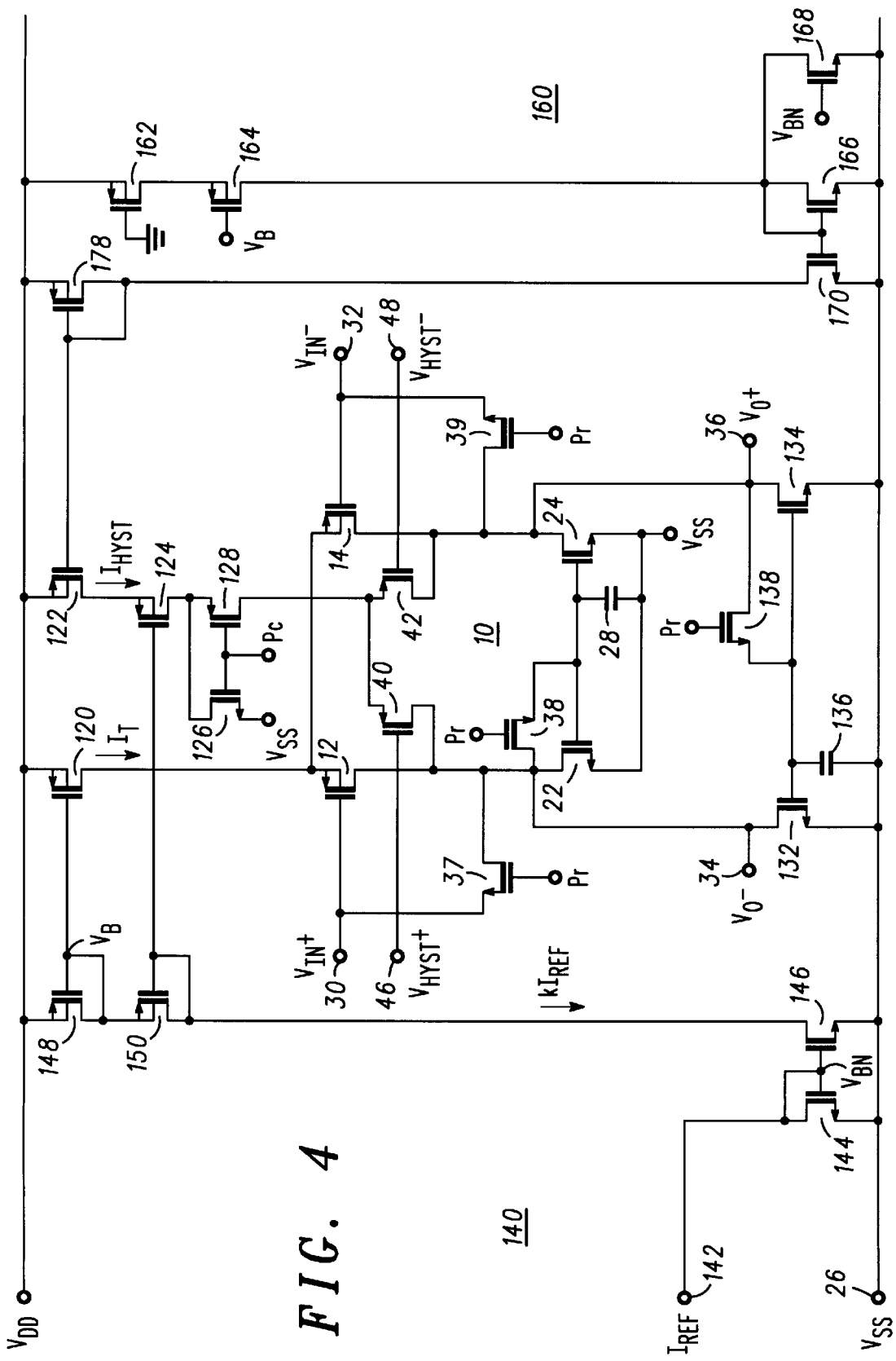
FIG. 4 is a more detailed schematic diagram of the present invention.

Turning now to FIG. 4, comparator 10 and the hysteresis circuit portion is shown in more detail along with hysteresis current generating circuitry 160. A reference current source 140 is provided which sets not only the tail current $I_T$ but also establishes the hysteresis current $I_{HYST}$. A reference current $I_{REF}$ is supplied at terminal 142 of the integrated circuit comprising the comparator and hysteresis circuit of the present invention. The reference current is sourced through diode connected NMOS transistor 144 which, as shown is diode connected having its drain and gate coupled to the gate of NMOS transistor 146. The interconnection of transistors 144 and 146 form a current mirror such the gate to source voltage of transistor 144 is set at a voltage $V_{BN}$ as the transistor is diode connected. Since, the gate of transistor 146 is therefore biased at $V_{BN}$ it will sink a current $kI_{REF}$, where k is a scaling factor set by sizing of transistor 146 with respect to transistor 144. For example, if the two transistors were of equal size then k would be equal to 1 and the current sourced through transistor 146 would be equal to the current $I_{REF}$. The current $kI_{REF}$ is sourced from a pair of cascoded PMOS transistors 148 and 150. Again transistor 148 is diode connected to form a current mirror circuit in conjunction with PMOS transistor 120. Transistors 148 and 120 act as a current mirror circuit whereby the current $kI_{REF}$ sourced through transistor 148 in turn establishes the tail current, $I_T$, through transistor 120. Similarly, sizing of transistor 120 to transistor 148 can establish the desired value for $I_T$. Likewise, transistor 150 is diode connected to provide a bias voltage to cascode device 124 as will be described later.

Comparator stage 10 is illustrated as having additional load devices formed by NMOS transistors 132 and 134 and voltage holding capacitor 136. The additional load devices may be included in attempt to reduce any mismatch offsets of comparator stage 10 associated with processing variations and temperature. Switches 43, 50, 52 and 54 of FIG. 1 are realized by PMOS transistor 128 and NMOS transistors 37, 39, and 38 respectively. Likewise, NMOS transistor 138 acts as a switch responsive to $P_r$ for connecting transistor 134 as a diode during the reset phase of the system.

The hysteresis current, $I_{HYST}$, is produced by current generator circuit 160 as will now be discussed. Current generator circuit 160 includes triode connected PMOS transistor 162 having its source electrode connected to $V_{DD}$ and its drain electrode connected to the source electrode of PMOS transistor 164 while its gate electrode, although shown as generally connected to ground, would be at the same potential as $V_{SS}$. The gate electrode of transistor 164 is connected to the gate of transistor 148 and is biased at the bias voltage $V_B$, set by the diode connected transistor 148, whereby a current is sourced from the drain of transistor 164, the magnitude of which is related to $I_{REF}$ and the current flowing through transistor 148 as well as the source degeneration effect of transistor 162. NMOS transistor 166 acts as a current sink for transistor 164 in that it has its drain electrode coupled to the drain electrode of the latter and its source electrode connected to $V_{SS}$ while its gate electrode is connected to its drain electrode. Therefore, transistor 166 also having its gate electrode connected to the gate electrode of NMOS transistor 170 again forms a current mirror with transistor 170 the latter of which will sink a current that is a multiple factor of the current sourced from transistor 164 to transistor 166 in the manner previously described. Similarly, diode connected PMOS transistor 178 having its source and drain electrodes coupled in series with transistor 170 to source the current required by the latter will mirror this current through PMOS transistor 122 as these two transistors also are connected as a current mirror. Hence PMOS transistor 122 will source the current $I_{HYST}$ therefrom which is determined by current generator circuit 160. Transistor 122 therefore corresponds to the current source 44 illustrated in FIG. 1. PMOS transistor 124 shown as having its source coupled to the drain of PMOS transistor 122 and its drain coupled to the source of PMOS transistor 128 in a cascode configuration while its gate is coupled to the gate of PMOS transistor 150. This configuration attempts to stabilize $I_{HYST}$. PMOS transistor 128 functions as a switch when rendered conductive responsive to $P_C$ being in a low state to source $I_{HYST}$ to the commonly connected source electrodes of transistors 40 and 42. NMOS transistor 126 provides a path to $V_{SS}$ for $I_{HYST}$ when $I_{HYST}$ is not injected into either one of the transistors 40 or 42 during time t3–t4. This serves to decrease transient variations of $I_{HYST}$ due to switching from the comparison phase to the next reset phase.

Triode connected PMOS transistor 162, which acts as a source degeneration device, and NMOS transistor 168 are utilized to produce a hysteresis current which will compensate for variations in the gm of input pair transistors 12 and 14. Transistor 168, as shown, has its gate electrode biased by the voltage $V_{BN}$ that is set up at the gate of transistor 144 while its drain electrode is coupled to the drain of transistor 164 and its source returned to $V_{SS}$. Generally, the gate to source voltage of transistor 164, although biased at the voltage set at the gate of transistor by transistor 148, will be reduced by the resistance created by triode connected transistor 162. Thus, a reduced current flows through transistor 164. This current will be substantially reduced if the gm of transistor 162 is reduced, i.e., its resistance is increased. Likewise, as the gm is increased, the current flowing through transistor 164 will approach the value of the current flowing through transistor 148 if the two transistors are equally sized. Since transistor 162 is made of like material and is ideally located near input transistors 12 and 14, this effect can be utilized to compensate for gm variation in the input transistor pair. If managed properly, the gm variation can be nearly canceled However, the gm shift that can be adjusted by triode connected transistor 162 is not enough in itself to realize the level of cancellation needed to offset the gm variations in the input transistor pair. Using transistor 168 can further enhance the hysteresis current variation by removing a fixed amount of the current sourced to transistor 166 by shunting current therefrom. A properly managed combination of the afore described two effects may provide near complete cancellation of gm variations effects on the resulting hysteresis level. As an example, assuming the current through transistor 164 may vary plus or minus 15 percent, if transistor 168 is set to shunt fifty-five percent of the nominal current flow from transistor 164, the current flow through transistor 166 will then vary by plus or minus thirty-three percent. Since the current flow through transistor 166 is mirrored by transistor 170 to ultimately set the magnitude of $I_{HYST}$, $I_{HYST}$ will also vary in its magnitude which will stabilize the hysteresis voltage in the comparator stage 10 by canceling the effects of input transistor variations.

Thus, what has been described is a novel comparator for sampling incoming input signals and circuit induced offsets during a reset period followed by a comparison period wherein the sampled input signals would be compared and the offsets canceled. Additionally, a hysteresis circuit is provided such that an additional hysteresis offset is created and stored during the reset period, but removed during the following comparison period, whereby the hysteresis offset is not canceled but rather remains superimposed on the stored input signals to influence the current comparator decision based on the result of the previous comparison. Hence, the comparator is controlled by a tightly toleranced hysteresis. The hysteresis circuit reduces the sensitivity of the comparator stage to noise due to the timed application of the hysteresis current during reset and the non-overlapping portion of the reset pulse and comparison pulse. Additionally, a compensated hysteresis current generator cancels the effects of gm variations, in the input transistor pair of the comparator thereby allowing for tightly controlled hysteresis levels over temperature and integrated circuit process variations.

What is claimed is:

1. A hysteresis circuit for introducing a hysteresis voltage offset into a switched comparator circuit, the comparator circuit having first and second inputs to which input signals are applied and stored during a reset period and which are compared during a following comparison period by the comparator for providing output signals at first and second outputs thereof, the hysteresis circuit comprising:

a current generating circuit for sourcing a hysteresis current at an output thereof;

a circuit receiving said hysteresis current and having first and second inputs at which is applied a differential hysteresis voltage, the polarity of which depends on the comparator output signals produced during the previous comparison period such that said circuit produces a hysteresis voltage offset in response to said hysteresis current at a selected one of the first and second inputs of the switched comparator depending on the polarity of said differential hysteresis control voltage applied thereto during the current reset period; and a switch circuit for connecting said output of said current generating circuit to said circuit during said current reset period and disconnecting the same therefrom during said following comparison period wherein said hysteresis voltage offset is not canceled during said following comparison period but remains superimposed on the stored input signal applied at said selected input to influence the output of the switched comparator during said following current comparison period based on the output of the switched comparator resulting from said previous comparison period.

2. The hysteresis circuit of claim 1 wherein said circuit comprises first and second transistors each having a first electrode connected to said switch circuit, a control electrode coupled respectively to said first and second inputs of said circuit, and a second electrode coupled to a respective load device of the switched comparator wherein one or the other of said first and second transistors is rendered conductive during said reset period depending on the polarity of said differential hysteresis voltage applied to said first and second inputs of said circuit for sourcing said hysteresis current to the respective load device.

3. A circuit, comprising:

a current generating circuit having an output for providing a current;

a switch circuit having a first terminal coupled to the output of the current generating circuit and a second terminal; and a hysteresis circuit having an input coupled to the second terminal of the switch circuit and an output for providing a hysteresis control signal.

4. The circuit of claim 3, wherein the hysteresis circuit comprises:

a first transistor having a first electrode coupled to the second terminal of the switch circuit, a second electrode coupled to a first output of the circuit, and a control electrode coupled for receiving a first control signal; and a second transistor having a first electrode coupled to the second terminal of the switch circuit, a second electrode coupled to a second output of the circuit, and a control electrode coupled for receiving a second control signal.

5. The circuit of claim 4, further comprising:
- a third transistor having a first electrode coupled to the first output of the circuit, a second electrode coupled for receiving a reference potential, and a control electrode;
- a fourth transistor having a first electrode coupled to the second output of the circuit, a second electrode coupled for receiving the reference potential, and a control electrode coupled to the control electrode of the third transistor;
- a second switch circuit having a first terminal coupled to the first electrode of the third transistor and a second terminal coupled to the control electrode of the third transistor; and
- a capacitor having a first terminal coupled to the control electrode of the third transistor and a second terminal coupled for receiving the reference potential.

6. The circuit of claim 3, wherein the current generating circuit includes a current source having a first terminal coupled for receiving a reference potential and a second terminal for providing the current.

7. The circuit of claim 3, wherein the current generating circuit includes:
- a first transistor having a first electrode coupled for receiving a first reference potential, a second electrode for providing the current, and a control electrode;
- a second transistor having a first electrode coupled for receiving the first reference potential, a second electrode coupled to the control electrode of the first transistor, and a control electrode coupled to the control electrode of the first transistor;
- a third transistor having a first electrode coupled for receiving the first reference potential, a second electrode, and a control electrode coupled for receiving a second reference potential; and
- a fourth transistor having a first electrode coupled to the second electrode of the third transistor, a second electrode, and a control electrode coupled for receiving a first bias signal.

8. The circuit of claim 7, wherein the current generating circuit further includes:
- a fifth transistor having a first electrode coupled to the second electrode of the fourth transistor, a second electrode coupled for receiving a third reference potential, and a control electrode coupled to the first electrode of the fifth transistor;
- a sixth transistor having a first electrode coupled to the second electrode of the second transistor, a second electrode coupled for receiving the third reference potential, and a control electrode coupled to the control electrode of the fifth transistor; and
- a seventh transistor having a first electrode coupled to the second electrode of the fourth transistor, a second electrode coupled for receiving the third reference potential, and a control electrode coupled for receiving a second bias signal.

9. A method for providing hysteresis, comprising:
- providing a hysteresis current during a first time period to generate a hysteresis voltage offset;
- storing the hysteresis voltage offset;
- superimposing the hysteresis voltage offset on a first input signal;
- comparing the first input signal to a second input signal, wherein the first input signal includes the superimposed hysteresis voltage offset; and
- removing the hysteresis current during a second time period to remove the source of the hysteresis voltage offset.

10. The method of claim 9, further including compensating the hysteresis current so that the resulting hysteresis voltage offset is substantially process and temperature invariant.

* * * * *